United States Patent
Hong et al.

(10) Patent No.: US 6,730,364 B2
(45) Date of Patent: May 4, 2004

(54) PREPARATION OF CARBON MOLECULAR SIEVE MEMBRANES ON POROUS SUBSTRATE

(75) Inventors: Franklin Chau-Nan Hong, Tainan (TW); Liang-Chun Wang, Tainan (TW); Yoou-Bin Guo, Tainan (TW)

(73) Assignee: National Science Council, Taipei (TW)

( * ) Notice: Subject to any disclaimer, the term of this patent is extended or adjusted under 35 U.S.C. 154(b) by 119 days.

(21) Appl. No.: 10/107,142

(22) Filed: Mar. 28, 2002

(65) Prior Publication Data

US 2003/0185998 A1 Oct. 2, 2003

(51) Int. Cl.$^7$ .................. B01D 67/00; B01D 69/10; C23C 16/26; C23C 16/505
(52) U.S. Cl. .................. 427/535; 427/2.3; 427/533; 427/577; 427/245; 427/249.2; 427/255.23; 427/255.28; 118/723.1; 95/45; 95/285; 96/11
(58) Field of Search .................. 427/2.3, 523, 532, 427/533, 535, 569, 577, 570, 226, 228, 372.2, 243, 244, 245, 249.1, 249.2, 249.3, 255.23, 255.28; 118/723 R, 723.1; 95/45, 55, 285; 96/4, 8, 11, 12

(56) References Cited

U.S. PATENT DOCUMENTS

| | | | | |
|---|---|---|---|---|
| 3,979,330 A | * | 9/1976 | Munzner et al. | 502/420 |
| 4,685,940 A | * | 8/1987 | Soffer et al. | 96/8 |
| 5,238,888 A | * | 8/1993 | Abe | 502/5 |
| 5,262,198 A | * | 11/1993 | Liu et al. | 427/249.1 |
| 5,695,818 A | * | 12/1997 | Soffer et al. | 427/248.1 |

FOREIGN PATENT DOCUMENTS

| | | |
|---|---|---|
| EP | 0 497 003 A2 * | 8/1992 |
| EP | 0 617 997 A1 * | 10/1994 |

* cited by examiner

*Primary Examiner*—Shrive P. Beck
*Assistant Examiner*—Wesely D. Markham
(74) *Attorney, Agent, or Firm*—Bacon & Thomas

(57) ABSTRACT

A method for preparing carbon molecular sieve membrane is invented. A thin carbon-containing film is first deposited on a porous substrate. The thin film is then bombarded by high energy ions for surface modification. The surface modified film is then baked or calcined at a high temperature. The carbon molecular sieve membrane prepared according to the present invention can be used for gas separation as well as liquid separation, ions or solvents, etc., exhibiting improved permeance and improved selectivity simultaneously in gas separation. The ion bombardment includes generating plasma and ions in a gas phase, and applying a negative bias voltage to the substrate.

27 Claims, 2 Drawing Sheets

PREPARATION OF CARBON MOLECULAR SIEVE MEMBRANES ON POROUS SUBSTRATE

FIELD OF THE INVENTION

The present invention is related to a process for preparing a carbon molecular sieve membrane, and in particular for preparing a supported carbon molecular sieve membrane.

BACKGROUND OF THE INVENTION

Currently, carbon molecular sieve membranes are prepared by subjecting a thermoset polymer to pyrolysis or calcination at a high temperature in an inert gas or vacuum environment, thereby releasing volatile gases, such as $H_2O$, CO, $CO_2$, $CH_4$, HCN, $N_2$ and $H_2$ etc., and forming an amorphous carbon membrane having a pore size of several microns to several angstroms. The pore size is closely related to the material of the polymer and the conditions of pyrolysis. Published researches on the carbon molecular sieve membranes are discussed in the following:

(1) Bird and Trimm used polyfurfuryl alcohol (PFA) to prepare non-supported and supported carbon molecular sieve membranes. Due to the occurrence of shrinkage during pyrolysis, a continuous carbon separation membrane could not be produced [P. L. Trimm et al., Carbon, 21(3), 177, 1983].

(2) Koresh and Soffer have done a very systematic research on carbon molecular sieve membranes [J. E. Koresh and A. Soffer, Sep. Sci. Technol., 18 (1983) 723; J. E. Koresh and A. Soffer, Sep. Sci. Technol., 23 (1987) 973]. A hollow fibrous polymer membrane was calcined at a medium temperature (800–950° C.) in nitrogen or an inert gas, thereby forming a carbon molecular sieve membrane. The selectivity of He to $O_2$ was 8, and the selectivity of He to $N_2$ was 20. In particular, the permeance of He reached $3 \times 10^{-7}$ $mol.m^{-2}.s^{-1}.Pa^{-1}$, which was tens to hundreds times higher than that of a polymer membrane.

(3) Linkov et al. produced a three-zoned asymmetrical carbon membrane by subjecting a polyacrylonitrile, (PAN)-based hollow fibrous precursor to a thermal oxidation stabilization and a carbonization in an inert atmosphere [V. M. Linkov, R. D. Sanderson and E. P. Jacobs, J. Membrane Sci., 95 (1994) 93]. The intermediate zone had longitudinal voids with a length 5–15 $\mu m$ and a diameter 3–7 $\mu m$. The inner layer had voids with a pore size of 3–5 $\mu m$. The outermost layer is a denser layer of 0.1–0.4 $\mu m$. Subsequently, a mixture gas of $TiCl_4$ and $CH_4$ was subjected to a gas phase pyrolysis to grow a TiC membrane on said hollow carbon fiber, which was then subjected to a high temperature oxidation in order to reduce the pore size on the outermost layer to less than 90 nm. In 1994, a combined magnetron sputtering and ion beam technique was used to coat a diamond-like carbon (DLC) membrane on the abovementioned fiber. The results indicated that a low sputtering rate could form a continuous membrane which fully covered the original voids. However, this composite membrane (without receiving a further carbonization) still had a Knudsen diffusion mechanism in transporting gas, and not a molecular sieve mechanism.

(4) Yamada et al. produced a carbon molecular sieve *membrane by subjecting a polyimide (PI) to a carbonization [Y. Yamada, et al., Carbon, 30, 719, 1992].

The produced membrane had an oxygen-to-nitrogen separation ratio of 4.6 and had a molecular sieve mechanism.

(5) Damle et al. used various materials and methods to perform various surface treatments on a commercial carbon membrane having a pore size of 0.2–1.0 $\mu m$:

❶ dip-coating a polymer of polyacrylonitrile (PAN), polyfurfuryl alcohol (PFA), phenol-formaldehyde resin (PF) or cellulose precursors, on the carbon membrane;

❷ using a plasma polymerization to coat PAN on the carbon membrane; ❸ coating a solution of a PFA resin monomer on the carbon membrane, and adding a catalyst for an in-situ polymerization; ❹ using high temperature pyrolysis to decompose propylene into tiny carbon particles to deposit on the carbon membrane substrate [A. S. Damle at al., Gas Separation & Purification8(3), 137, 1994]. After the abovementioned processing, said membrane was subjected to high temperature carbonization in order to improve the properties of the carbon membrane. The results indicated that the permeance was reduced by all the abovementioned processing. Besides, except in-situ polymerization, the processing had no significant improvement in selectivity. Although the in-situ polymerization process slightly improved the selectivity, the transport mechanism was in Knudsen diffusion range without involving molecular sieve effect.

(6) Collins and Yin used a DC sputtering technique to coat a diamond-like carbon (DLC) on a silicon substrate, and carbonizing the coated substrate by a vacuum baking [Y. Yin and R. E. Collins, Carbon, 31 (1993) 1333]. A QCM (quartz crystal microbalance) was used to measure the absorption of benzene and 2,2-dimethylbutene in said carbon membrane. It was found that the absorption of benzene (5.2 Å) was at least ten times greater than the absorption of 2,2-dimethylbutene (6.0 Å). After the high temperature treatment, said diamon-like carbon membrane formed extremely fine pores on the membrane to have very conspicuous molecular sieve functions and could separate molecules of slightly different sizes. Furthermore, the porosity and the pore size distribution of said carbon membrane were affected by the sputtering conditions (e.g. composition of the gas, bias voltage of the target, etc.) and the conditions of high temperature treatments of diamond-like membrane. Therefore, the molecular sieve function could also be varied.

Meanwhile, many people have investigated silica-based molecular sieve membranes. The published results on this topic are outlined in the following:

(1) Gavalas et al. first successfully used a thermal CVD to effectively reduce the macropores of a Vycor glass substrate, by introducing $SiH_4$ and $O_2$ separately from both sides of the substrate in order to carry out reactions within the pores to form a molecular sieving $SiO_2$ membrane. The selectivity of $H_2$ to $N_2$ reached 1000; and the permeance of $H_2$ at 450° C. was $10^{-8}$ $mol.m^{-2}.s^{-1}.Pa^{-1}$. They also introduced $SiCl_4$ and $O_2$ into the pores from the same side of said glass substrate for reaction. The reaction temperature was 600–800° C.

(2) Yan et al. used a porous α-alumina tube as a substrate, which was first subjected to a boehimite solution dip-coating, followed by pyrolysis, thereby forming an γ-alumina membrane on the outside of the tube [S. Yan, H. Maeda, K. Kusakabe, S. Morooka and Y. Akiyama, Ind. Eng. Chem. Res., 33 (1994) 2096]. Then, tetraethylorthosilicate (TEOS) was used as a feed in thermal CVD to deposit $SiO_2$ membranes. The permeance of $H_2$ at 600° C. was $10^{-7}$ mol.m$^{-2}$.s$^{-1}$.Pa$^{-1}$, and the selectivity of $H_2$ to $N_2$ reached 1000.

A $SiO_2$ membrane could only withstand a temperature up to 500° C., and the separation of $H_2$ often requires a higher operating temperature. Furthermore, the $SiO_2$ membrane could only separate a mixture of small molecules (such as $H_2$, He etc.) and other gases. Therefore, many researchers proposed the membranes containing Si—C or Si—O—C structure. Such the structure could withstand a temperature up to 1200° C. and separate gases at a higher temperature. Furthermore, the pore size could be controlled to separate a mixture of gases with similar molecule sizes (e.g. $O_2$, $N_2$ having a difference of 0.2 Å).

(1) Tsay, Dah-Shyang et al. produced a SiC molecular sieve by adding 5% of alumina into a raw material; sintering the material into a porous tube; coating the inner wall of the tube with a SiC having a particle size of 30 nm and containing 2% of alumina; sintering said tube into an asymmetrical tube; filling the tube with a polydimethylsilane solution; and subjecting the tube to a thermal treatment, a curing and a pyrolysis. A separation membrane, which was pyrolyzed at 300° C., had a $H_2$ permeance of $10^{-7}$ mol.m$^{-2}$.s$^{-1}$.Pa$^{-1}$ at 200° C., and a $H_2/N_2$ selectivity of up to 100. A separation membrane, which was pyrolyzed at 600° C., had a $H_2$ permeance of $5 \times 10^{-9}$ mol.m$^{-2}$.s$^{-1}$.Pa$^{-1}$ at 200° C., and a $H_2/N_2$ selectivity of about 40.

(2) Kusakabe and Morook et al. first used a γ-alumina membrane to reduce the pore size on an α-alumina tubular substrate [Z. Li, K. Kusakabe and S. Morooka, J. Membrane Sci., 87 (1996) 159; Z. Li, K. Kusakabe and S. Morooka, Sep. Sci. Technol., 32 (1997) 1233]. A polycarbosilane (PC) membrane was coated thereon by pyrolysis at 350–550° C. The membrane had a $H_2$ permeance of $5 \times 10^{-7}$ mol.m$^{-2}$.s$^{-1}$.Pa$^{-1}$ at 400° C., and a $H_2/N_2$ selectivity of about 7.2. Said Si—C—O membrane was repetitively coated three times and pyrolyzed at 950° C., thereby increasing the $H_2/N_2$ selectivity to 18–63, but the $H_2$ permeance was reduced to $10^{-9}$–$10^{-8}$ mol.m$^{-2}$.s$^{-1}$.Pa$^{-1}$ at 500° C.

Therefore, there are two bottlenecks existing in the prior art methods for preparing carbon molecular sieve membranes: (1) The carbon membrane is not grown on the porous substrate. As a result, the mechanical strength of the membrane is not sufficient, and the carbon membrane is easy to crack. (2) A molecular sieve membrane grown on a porous substrate always uses a method of reducing the pore size to increase the selectivity at a cost of greatly reducing its permeance. Therefore, such a membrane has a limited applications.

SUMMARY OF THE INVENTION

A primary objective of the present invention is to provide a process for preparing a carbon molecular sieve membrane without the aforesaid drawbacks in the prior arts. The process of the present invention uses a novel technique to form a carbon molecular sieve membrane on a porous substrate, which has a high selectivity while maintaining a high permeance.

In order to achieve the abovementioned objective, a process for preparing a carbon molecular sieve membrane according to the present invention comprises the following steps:

(a) growing an amorphous carbon-based membrane on a porous substrate at a low temperature, where said membrane is able to be pyrolyzed or decomposed at a temperature higher than the growth temperature;

(b) performing a surface modification by bombarding said membrane with energized gaseous ions; and (c) baking said surface-modified membrane at a temperature higher than the growth temperature in Step (a), so that a membrane having gas separation ability is formed.

Said amorphous carbon-based membrane comprises carbon as a major portion thereof and, optionally, other elements selected from the group consisting of Al, Si, O, N, P and F.

Said surface modification by bombarding the membrane with energized ions can be carried out with a means selected from means for generating plasma, laser or ion beams, wherein a negative bias voltage is applied to said substrate, or an ion gun or an ion implantation device can be used to accelerate ions. A suitable surface modification condition includes: bombarding said membrane with energized ions at a pressure less than $10^5$ Pa and with an ion acceleration bias voltage less than 5000 volts, preferably 10–100 volts.

Said baking of the process of the present invention can be carried out, for example, at a pressure of 0.001 Pa–$2 \times 10^5$ Pa, in an environment of vacuum, $N_2$ or an inert gas such as He or Ar, and for a period of time up to 100 hours.

Preferably, the process according to the present invention further comprises repeating Steps (a), (b) and (c) one or more cycles, thereby further improving the separation effect of the membrane.

In one of the preferred embodiments of the present invention, said growth of said amorphous carbon-based membrane in Step (a) comprised using an inductively-coupled-plasma chemical vapor deposition (ICP CVD) to grow said membrane on said porous substrate. Suitable conditions for growing said membrane include: a gas phase pressure of $10^{-3}$–100 torr; a reaction gas mixture comprising 5–100 vol. % of a carbon-containing gas such as hexamethyldisiloxane (HMDSO) or methane, and 95–0 vol. % of $O_2$ or an oxygen-containing gas; preferably 95–5 vol. % of $O_2$, a total flowrate of 0.5–10 sccm; RF high frequency power of 20–1000 W; and a processing time of 0.1–20 hours.

Said surface modification by bombarding said membrane with energized ions in Step (b) was carried out by means of an inductively-coupled-plasma chemical vapor deposition and applying a negative bias voltage to said substrate, wherein conditions of generating plasma include: a gas pressure of $10^{-3}$–100 torr; a gas composition comprising 5–100 vol. % of a carbon-containing gas such as hexamethyldisiloxane (HMDSO) or methane, preferably HMDSO, 95–0 vol. % of $O_2$ or an oxygen-containing gas, preferably $O_2$, and 95–0 vol. % of an inert gas; a total gas flowrate of 0.5–10 sccm; RF high frequency power of 20–1000 W; and a processing time of 1–1000 seconds, preferably 3–30 seconds. Preferably, said gas composition comprises 5–100 vol. % of said carbon-containing gas, and 95–0 vol. % of $O_2$. Preferably, said gas composition comprises 5–100 vol. % of said carbon-containing gas, and 95–0 vol. % of said inert gas.

After the surface-modified membrane being further subjected to said high temperature baking, the selectivity and the gas permeance of the resulting molecular sieve membrane can be greatly improved simultaneously. The reasons are believed to be: (1) By examining the gas permeance of a membrane which is baked often being subjected to surface modification, the increase of $H_2$ permeance is much larger than the increase of $N_2$ permeance. That is the voids formed by the surface modification followed by the baking only allow the passage of $H_2$ in a large quantity while inhibiting the passage of $N_2$. (2) The dependence of $H_2$ permeance on the permeation temperature is opposite to that of $N_2$. The activation energy of $H_2$ is positive and its permeance increases with an increase in permeation temperature; while the activation energy of $N_2$ is negative and its permeance decreases with an increase in permeation temperature. Therefore, at a higher temperature, the selectivity of $H_2/N_2$ is greatly increased. Furthermore, the duration of the surface modification and the magnitude of the negative bias voltage all need to be optimized. The surface modification duration can be adjusted in a wider range when a smaller negative bias voltage is applied. When the duration of surface modification is too long, the modification effects are not evident. Moreover, the type of gas used in the surface modification is also influential. The use of pure Ar or pure $O_2$ in conducting the surface modification has a result not as good as that of hexamethyldisiloxane (HMDSO). However, a membrane which has been subjected to surface modification has much better separation capability than a membrane which has not been subjected to surface modification. Therefore, the composition of the gas used in the surface modification will affect the composition and the structure of the surface layer of the carbon membrane, and subsequently affect the separation performance.

Figure 1:
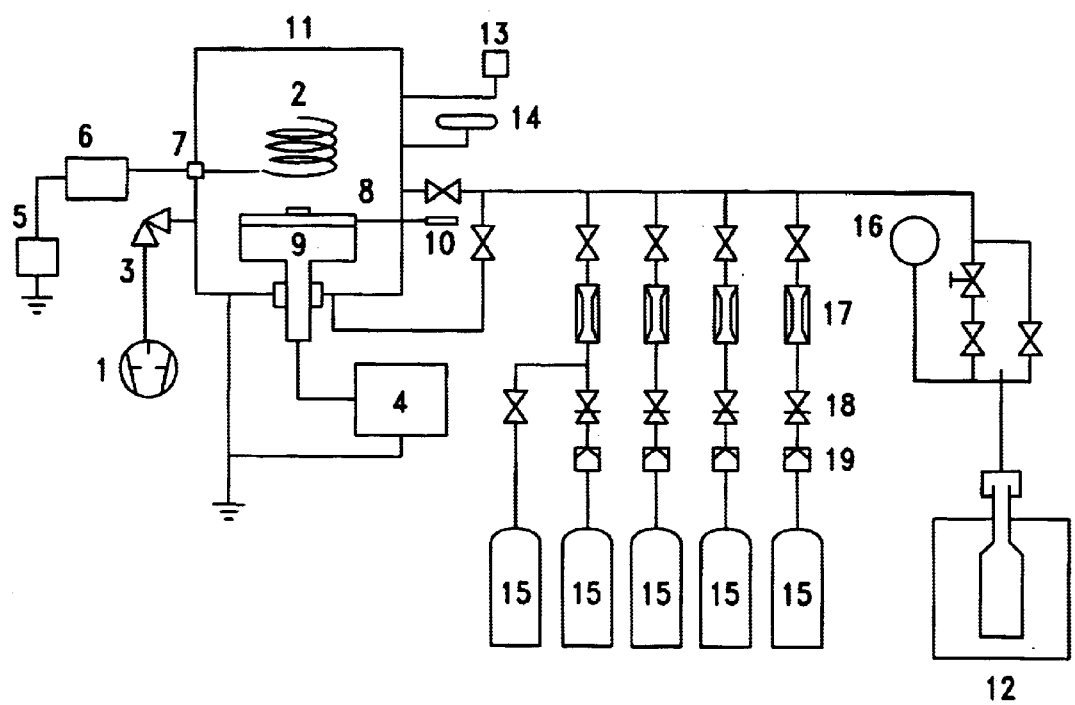
FIG. 1 shows a schematic diagram of a device for carrying out a membrane growth and the surface modification by using an inductively-coupled-plasma chemical vapor deposition (ICP CVD) according to the present invention.

| Legends: | |
|---|---|
| ❶ mechanical pump | coil |
| ❸ angle valve | ❹ ENI power supply |
| ❺ RF power supply | ❻ matching box |
| ❼ RF power introduction | ❽ substrate |
| ❾ substrate support | ❿ thermocouple |
| 11. vacuum chamber | 12. liquid source isothermal bath |
| 13. baratron pressure gauge | 14. convectron pressure gauge |
| 15. gas source | 16. pressure gauge |
| 17. mass flow controller | 18. safety shutoff |
| 19. gas filter | |

DETAILED DESCRIPTION OF THE INVENTION

The use of a carbon membrane in separating liquids or gases is one of the inorganic membrane techniques of high potentials. In comparison with the conventional polymer membrane, a carbon membrane used for microfiltration or ultra-microfiltration has advantages such as resistance to high temperatures, resistance to strong acids, strong bases and organic solvents, and excellent biocompatibility. A carbon molecular sieve has very tiny pore sizes, which vary from 3 Å from 10 Å. The pore sizes can be controlled to separate two gaseous molecules with a difference pore size within of 0.2 Å. At present, carbon molecular sieves are mainly used as an adsorbent in the pressure swing adsorption process. Some carbon molecular sieves have better separation capability than zeolites.

The application of membrane separation often encounters two problems: a low permeance and a low selectivity. A low permeance can be improved by increasing the surface area of a membrane; however, the capital cost is also increased as a result. A low selectivity can be improved by recycling or using a multi-stage process; however, the equipment and operational costs are increased. Therefore, a membrane is practical and has an industrial value only when the membrane has a high permeance and a high selectivity at the same time.

The application of carbon molecular sieve membranes has the following disadvantages: (1) It is difficult to produce an unsupported carbon membrane that is continuous and free of cracks or voids. This is because an ordinary unsupported carbon membrane is formed by pyrolyzing a polymer membrane. Molecules will decompose and escape during pyrolysis, and the membrane will shrink. When the shrinking of the membrane is uneven or too much, the resulting stress will cause the formation of cracks. (2) Furthermore, a carbon membrane is itself fragile, does not have a sufficient mechanical strength; can not withstand a high pressure, and ruptures easily. A polymer membrane is usually much tougher than a carbon membrane.

In order to overcome the abovementioned disadvantages, a carbon membrane layer with molecular sieving functions can be prepared on a porous substrate by a pyrolysis process or a membrane deposition process. The porous substrate per se can provide the strength required by the carbon molecular sieve. Besides a good film deposition technique can deposit a continuous film or membrane with a strong adhesion on the porous substrate. This can solve the problems of being fragile, easy-to-crack or insufficiently strong.

The separation of ions in a solution or gases is usually carried out by coating one or more denser membranes on a porous substrate. The methods of coating a membrane on a porous substrate include: an aqueous solution precipitation method, a sol-gel method, an electroplating method, a chemical vapor phase deposition (CVD) method, and a physical vapor phase deposition (PVD) method, etc. These methods have a common feature: In order to increase the selectivity of the membrane, the membrane needs to be denser, thicker, or consisting of multiple layers. As a result, the permeance will be greatly reduced. For example, a surface modification by a CVD method is usually used to decrease the pore sizes of the pores in order to increase the selectivity. However, the permeance is also greatly decreased since the pore sizes have become much smaller.

The present invention greatly increases the permeance and the selectivity of the membrane simultaneously by performing a surface modification to a membrane grown on a substrate, followed by a high temperature baking. This achievement can not be accomplished by an ordinary surface modification of membrane or a multi-layered membrane deposition. Another feature of the present invention is the use of an additional inductively coupled plasma. Another power supply can than be used to independently control the bias voltage of the substrate. Therefore, that the desired surface modification conditions can be controlled more accurately.

(1) Growth of Carbon Membrane (1)-1

An anodic membrane (porous alumina membrane) substrate was cleansed with tetrachloromethane ($CCl_4$), and then dried. A porous graphite substrate was coarsely polished by 3 μm alumina, and then finely polished by 0.3 μm and 0.05 μm alumina slurries, followed by washing with water and then dried. The anodic membrane substrate employed had a porosity of 50%, a diameter of 13 mm, thickness of 77 μm, and an average pore size of 0.02 μm.

(1)-2

The porous alumina membrane substrate or the porous graphite substrate were mounted in a vacuum chamber, with a vacuum of <1×10$^{-3}$ torr generated in the vacuum chamber.

(1)-3

The substrates were cleansed with Ar+ ions with the following cleaning

| Pressure | High frequency power source | Bias voltage of substrate | Time |
|---|---|---|---|
| 0.05 torr | 50 W | 200 V | 10 min |

(1)-4 Conditions for the Deposition of Membranes:

After introducing the reaction gases, the gas composition was adjusted by controlling gas partial pressure and the total pressure was adjusted by an evacuation valve. After the pressure had stablized, the deposition of the membrane was started by fixing the power of the high frequency power source.

(1)-5 Growth of Membrane:

During the deposition of the membrane, the variation of the plasma power was constantly monitored.

(2) Performing Surface Modification by Ion Bombardment:

There were two situations:

2-(a) The modification conditions were the same as the membrane growth conditions except the additional substrate bias during surface modification:

The bias voltage of the substrate and the operation time were set in advance. Then immediately after the completion of the membrane growth, the power supply for generating a bias voltage on the substrate was started.

2-(b) In addition to applying a bias voltage, the modification conditions were different from those of the membrane growth:

Upon completion of the growth of the membrane, the conditions for depositing the membrane were changed to the surface modification conditions.

(3) High Temperature Baking:

After the surface modification, the membrane was sent into a high temperature furnace to bake at 500° C. or 600° C. at 0.007 torr for 4 hours. The furnace temperature was raised at 2.4° C./min from room temperature.

The main difference between the present invention and the conventional multi-layer membrane approach or the conventional CVD surface modification lies in:

For an ordinary membrane-deposition method to increase the membrane selectivity, the membrane needs to be denser, thicker or having more layers, thereby usually reducing the permeance. For example, for an ordinary CVD method to perform a surface modification, the sizes of the pores are decreased to increase the selectivity. However, since the pore sizes have become smaller, the permeance is also decreased significantly.

A plasma surface modification method according to the present invention can dramatically increase the permeance and the selectivity simultaneously. This has a great difference with the ordinary composite membrane concept or pore-size-reducing concept, and thus has novelty and non-obviousness. The present invention performs a surface modification to a grown membrane, followed by a high temperature baking. As a result, the $H_2$ permeance of a membrane prepared according to the present invention is far higher than that of a membrane without being subjected to the surface modification before pyrolysis. Therefore, the surface modification by an ion bombardment according to the present invention, unlike the ordinary modification method for increasing the selectivity where the permeance is sacrificed, can greatly increase the permeance and the selectivity of the membrane simultaneously. The permeance of $H_2$ can reach $(1-5) \times 10^{-6}$ mol/m$^2$.s.Pa and the selectivity can reach 81. At present, the highest $H_2$ permeance of a molecular sieve published in the literature is about $10^{-7}$ mol/m$^2$.s.Pa. The results of the present invention are ten times higher than the highest value published in the literature.

The present invention performs a surface modification by an ion bombardment first, and then a high temperature baking. In other words, the present invention does not perform a surface modification (depositing a second layer of membrane) on an established carbon molecular sieve (which has been subjected to a high temperature pyrolysis), but performs a surface modification prior to the high temperature pyrolysis. The objective of the high temperature baking according to the present invention is not for forming a second layer of membrane by the surface modification. That is the present invention does not use a high temperature pyrolysis to reduce the pore sizes in order to increase the selectivity. Instead, the high temperature baking is to pyrolyse a carbon precursor membrane formed by the low temperature growth and the ion bombardment. The surface microstructure so obtained is greatly different from that of a membrane which was directly subjected to the high temperature baking without receiving the surface modification first. Furthermore, a change of such a microstructure requires an ion bombardment with a suitable energy. For an ordinary CVD method, the components in the gas phase will not form energized ions, and therefore will not have the abovementioned effects.

Furthermore, the source of gas phase components used in the ion bombardment according to the present invention does not necessarily contain a component such as carbon, silicon, or aluminum, etc. that can form a membrane. An ion bombardment by Ar, $O_2$ etc. still has the effect of increasing the separation effect. Therefore, the present invention is greatly different from the CVD surface modification method where only a feed capable of deposition is used, or followed by the additional pyrolysis of the deposition layer.

The main differences between the present invention and the conventional plasma-enhanced CVD method or the thermal pyrolysis method in preparing a molecular sieve membrane are:

(1) Using a plasma-enhanced CVD method to deposit a membrane, followed by a surface modification by applying a bias voltage for an appropriate period of time:

The surface modification of the membrane comprises bombarding the surface of the membrane with ions for a suitable period of time. The surface modification of the membrane by an ion bombardment can be done by generating a plasma and ions in a gas phase by various methods, and by applying a negative bias voltage to a substrate attached to the membrane for accelerating the ions in bombarding the surface of the membrane.

(2) The membrane must receive a surface modification followed by a high temperature baking in order to greatly increase the selectivity and the permeance while separating a mixture gas:

The membrane with a surface microstructure formed by an ion bombardment modification needs to be subjected to a high temperature baking in order to form a membrane having a high permeance and a high selectivity simultaneously.

The present invention can be better understood through the following examples and drawings.

FIG. 1 shows a schematic diagram of a device suitable for performing a membrane growth and a surface modification by an inductively-coupled-plasma CVD method, which mainly comprises:

| ❶ mechanical pump | ❷ coil |
|---|---|
| ❸ angle valve | ❹ ENI power supply |
| ❺ RF power supply | ❻ matching box |
| ❼ RF power introduction | ❽ substrate |
| ❾ substrate support | ❿ thermocouple |
| 11. vacuum chamber | 12. liquid source isothermal bath |
| 13. baratron pressure gauge | 14. convectron pressure gauge |
| 15. gas source | 16. pressure gauge |
| 17. mass flow controller | 18. safety shutoff |
| 19. gas filter | |

A detailed description of some parts of 11 vacuum chamber; ⑨ substrate support; vacuum pressure gauge; reaction gas transport system; evacuation system; power supply system follows:

11. Vacuum Chamber:

Cylindrical: diameter 32 cm, height 32 cm, thickness 0.6 cm, made of 316 stainless steel.

❾ Substrate Support:

A disk on the top of the substrate support is used for mounting the substrate. In order to avoid contaminating the membrane, the disk is made of graphite (because the membrane to be deposited is a carbon membrane). The inside of the disk is inserted with a thermocouple ❿ (K-type Chromel/Alumel type, non-grounding type) for measuring the temperature of the substrate. The thermocouple is wrapped with a quartz pipe in order to isolate itself from the graphite disk.

Vacuum Pressure Gauge:

The membrane deposition system uses two types of pressure gauges to measure the pressure inside the chamber. They are a baratron pressure gauge 13 and a convectron pressure gauge 14:

(1) Baratron pressure gauge: Its reading is independent of the type of the gas, and has a measurement range of $1-10^{-4}$ torr. This pressure gauge is used to accurately measure the pressure during the ICP CVD of membrane in the present system.

(2) Convectron pressure gauge: This is a thermocouple type vacuum gauge, and is used to measure the amount of heat carried away by the collision between the gas molecules and the heated body in the system and convert the measurement into a pressure in the system. Its reading will vary depending on the type of gas. An actual pressure value can be obtained by using a conversion curve provided by the operation manual. This pressure gauge can measure a pressure of $1000 \sim 10^{-4}$ torr.

Reaction Gas Transport System:

The transport path of the reaction gas is shown in FIG. 1. Its flowrate is accurately controlled by a mass flowrate controller 17. The vapor pressure is controlled by an isothermal bath 12. A needle valve is used to control the flowrate. The magnitude of the actual flowrate needs to be calibrated.

Evacuation System:

A mechanical pump ❶ and a Root's pump are used. The terminal pressure of the mechanical pump ❶ can be lower than $1 \times 10^{-3}$ torr. In the system, this pump is used for a primary pumping and as an upstream pump for the Root's pump. The pressure of the Root's pump can be lower than $1 \times 10^{-3}$ torr. The Root's pump is used to increase the evacuation rate in the system.

Power Supply System:

Both power supply devices supply a.c. power. An RF high frequency power supply ❺ is made by the HUTTINGER Co. of Germany. It has a fixed frequency of 13.56 MHz and is used as the power of the inductively-coupled plasma (ICP) in the system. Another is an ENI power supply ❹ which is made by the ENI Co. of the U.S.A. with an adjustable frequency (50~230 kHz) and a maximum output power of 5 kW (800V×6.25A), and is used to apply a bias voltage to the substrate in the system.

Examples 1–3

Different Modification Durations

Using an inductively-coupled-plasma chemical vapor deposition (ICP CVD) to deposit a membrane on a porous alumina membrane substrate, the growth conditions for the membranes were: a total pressure of 0.05 torr, a vapor phase composition of 50% HMDSO+50% $O_2$ (based on the partial pressure ratio), a total flow rate of 3.42~5.20 sccm, an RF power of 100W, and a period of one hour. The surface modification conditions were the same as the membrane growth conditions, except a negative bias voltage of 50V was applied to the substrate. After the surface modification, the substrate was baked at a high temperature furnace at a pressure of 0.007 torr and 600° C. for 4 hrs, with a temperature rising rate of 2.4° C./min from room temperature. Table 1 shows the gas permeances of the membranes subjected to surface modification at a bias voltage of 50V for various durations. The permeances of $H_2$, $N_2$, $O_2$ at several permeation temperatures and the selectivity of $H_2/N_2$, $O_2/N2$ are listed. The durations of the bias voltage were from 5 to 30 seconds.

TABLE 1

The dependence of gas separations on the duration of surface modifications at −50 V.

| | | Example | | |
|---|---|---|---|---|
| | | 1 | 2 | 3 |
| Conditions | Duration (sec) | 5 | 10 | 30 |
| permeance | | | | |
| $H_2$ | Room temp. | 15.58 | 6.24 | 2.36 |
| | 100° C. | 19.81 | 9.83 | 3.32 |
| | 150° C. | 23.43 | 11.15 | 4.24 |
| $N_2$ | Room temp. | 0.47 | 0.34 | 0.34 |
| | 100° C. | 0.59 | 0.30 | 0.24 |
| | 150° C. | 0.81 | 0.26 | 0.21 |
| $O_2$ | Room temp. | 1.70 | 0.43 | 0.35 |
| | 100° C. | 2.04 | 0.43 | 0.25 |
| | 150° C. | 2.35 | 0.43 | 0.23 |
| selectivity | | | | |
| $H_2/N_2$ | Room temp. | 33 | 19 | 7 |
| | 100° C. | 34 | 32 | 14 |
| | 150° C. | 29 | 43 | 20 |

TABLE 1-continued

The dependence of gas separations on the duration of surface modifications at −50 V.

|  |  | Example | | |
|---|---|---|---|---|
|  |  | 1 | 2 | 3 |
| Conditions | Duration (sec) | 5 | 10 | 30 |
| $O_2/N_2$ | Room temp. | 3.62 | 1.27 | 1.03 |
|  | 100° C. | 3.47 | 1.42 | 1.06 |
|  | 150° C. | 2.91 | 1.61 | 1.11 |

The unit of gas permeance is $10^{-7}$ mol/m$^2$ · s · Pa.

Comparative Example 1–4

All membrane deposition conditions and surface modification conditions for the Comparative Examples 1–4 were the same as those of Examples 1–3, except that a negative bias voltage was not used in Comparative Example 1. The modification durations for Comparative Examples 2–4 were 60–300 seconds which were longer than those used in Examples 1–3. The separation results are shown in Table 2.

Figure 2:
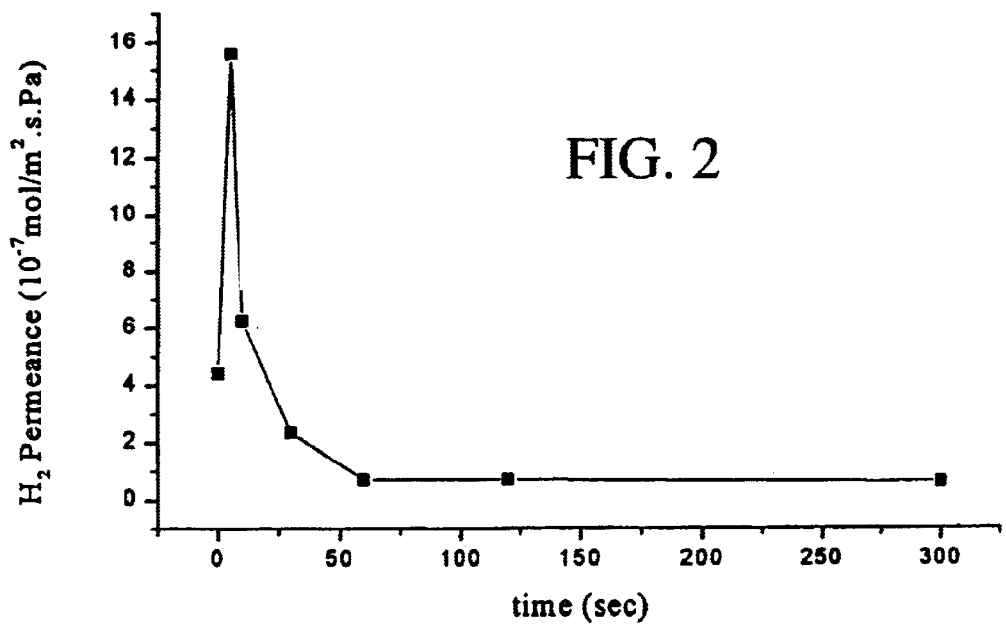
FIG. 2 shows the relationship between the duration of the surface modification and the H2 permeance at room temperature.
Figure 3:
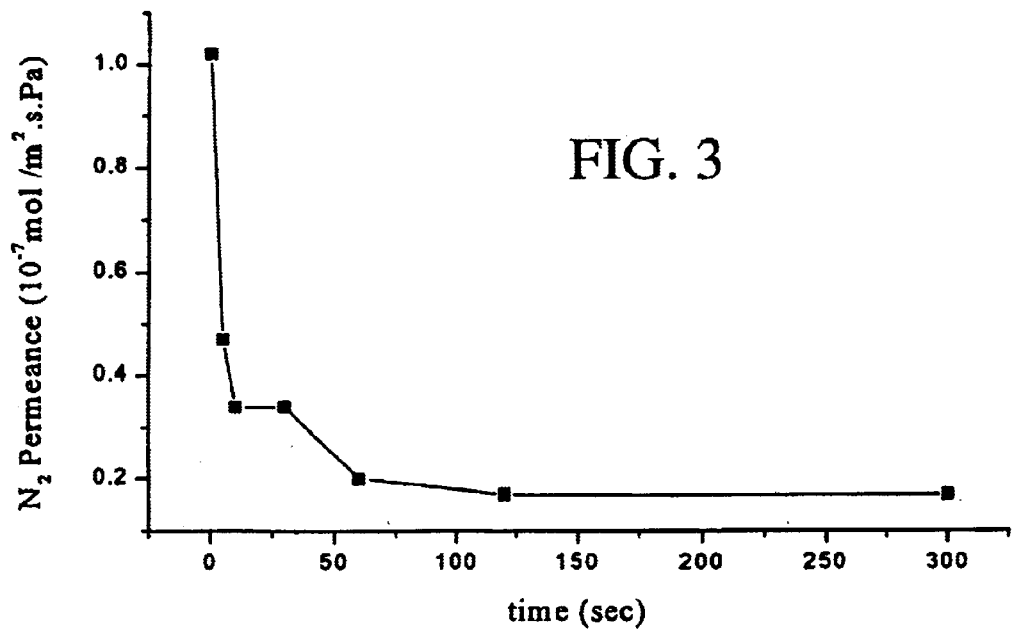
FIG. 3 shows the relationship between the duration of the surface modification and the $N_2$ permeance at room temperature.

As shown in FIG. 2, the permeance of $H_2$ at room temperature of the membrane of Example 1 is 15.58×10$^{-7}$ mol/m$^2$.s.Pa, wherein a negative bias voltage was applied for 5 second, which is far larger than the permeance of $H_2$ of the membrane of Comparative Example 1 (4.42×10$^{-7}$ mol/m$^2$.s.Pa), wherein a bias voltage was not applied. Even considering that the plasma in these two cases might be slightly different, it still can be sure that the permeance of the membrane after being surface-modified to a negative bias voltage for 5 seconds is larger than the permeance of the membrane without being modified. This result is contrary to the assumption that a new layer is formed on top of the ICP CVD layer during the surface modification, because the coverage of the new layer will reduce the permeance of the resulting membrane instead of increasing the permeance thereof. It is deemed that the application of a negative bias voltage for 5 seconds should be interpreted as some kind of surface modification, instead of depositing an additional layer or blocking the pores on the surface. After the surface-modified membrane has been subjected to a high temperature baking, the atomic movements, the breakage or formation of chemical bonds on the surface thereof and the shrinkage of the membrane might be completely different from the membrane that has not been subjected to a surface modification prior to the high temperature baking. Therefore, in comparison with the membrane without the surface modification, the pores on the surface of the surface modified membrane can effectively inhibit the permeance of $N_2$ (FIG. 3) and conspicuously increase the permeance of $H_2$ (FIG. 2).

Therefore, comparing the separation results of Comparative Example 1 with Example 1, one can realize that the process according to the present invention is not based on the concept of ordinary composite membranes, and also is not based on the an ordinary CVD process to modify the surface of the membrane. An ordinary CVD process undergoes surface modification to decrease the pore sizes, so that the selectivity of the membrane is increased with the permeance of the membrane being greatly reduced at the same time. The method of surface modification by plasma according to the present invention can greatly increase the permeance and the selectivity simultaneously, and is dramatically different from the ordinary concepts. The membrane prepared according to the process of the present invention has a $H_2$ permeance which is more than ten times higher than the highest (about $10^{-7}$ mol/m$^2$.s.Pa) of the carbon molecular sieve membrane disclosed in the literature.

Comparing the selectivities of Comparative Examples 2–4 with those of Examples 1–3, the former ones are conspicuously lower. This is due to the fact that the duration of surface modification is too long. Then, the pores of the membrane after high temperature baking are too small to allow a high permeance of $H_2$. Therefore, the duration of the surface modification needs to be optimized.

TABLE 2

The dependence of gas separation on the duration of surface modifications at −50 V.

| Comparative Example 1–4 | | 1 | 2 | 3 | 4 |
|---|---|---|---|---|---|
| Conditions | Duration (sec) | 0 | 60 | 120 | 300 |
| permeance | | | | | |
| $H_2$ | Room temp. | 4.42 | 0.71 | 0.71 | 0.63 |
|  | 100° C. | 12.05 | 0.87 | 0.74 | 0.55 |
|  | 150° C. | 26.52 | 1.07 | 0.84 | 0.58 |
| $N_2$ | Room temp. | 1.02 | 0.20 | 0.17 | 0.17 |
|  | 100° C. | 3.60 | 0.15 | 0.13 | 0.13 |
|  | 150° C. | 6.68 | 0.14 | 0.12 | 0.10 |
| $O_2$ | Room temp. | 1.31 | 0.17 | 0.18 | 0.21 |
|  | 100° C. | 3.75 | 0.10 | 0.12 | 0.16 |
|  | 150° C. | 7.52 | 0.10 | 0.11 | 0.15 |
| selectivity | | | | | |
| $H_2/N_2$ | Room temp. | 4.34 | 3.64 | 4.30 | 3.72 |
|  | 100° C. | 3.35 | 6.06 | 5.72 | 3.97 |
|  | 150° C. | 3.97 | 7.54 | 7.11 | 5.70 |
| $O_2/N_2$ | Room temp. | 1.28 | 0.87 | 1.06 | 1.21 |
|  | 100° C. | 1.04 | 0.70 | 0.94 | 1.22 |
|  | 150° C. | 1.13 | 0.66 | 0.94 | 1.43 |

The unit of gas permeance is $10^{-7}$ mol/m$^2$ · s · Pa.

Examples 4–6

Different Bias Voltages for Surface Modifications

All membrane deposition conditions and surface modification conditions were the same for Examples 4–6 and Examples 1–3, except the duration of bias voltage applied (10 seconds) and the negative bias voltages (10–40 V). The negative bias voltage and the separation results are shown in Table 3.

TABLE 3

|  |  | Example | | |
|---|---|---|---|---|
|  |  | 4 | 5 | 6 |
| Conditions | Bias (V) | 10 | 30 | 40 |
| permeance | | | | |
| $H_2$ | Room temp. | 18.73 | 10.39 | 8.93 |
|  | 100° C. | 22.72 | 15.53 | 10.74 |
|  | 150° C. | 25.06 | 17.60 | 11.65 |
| $N_2$ | Room temp. | 0.33 | 0.27 | 0.24 |
|  | 100° C. | 0.40 | 0.29 | 0.21 |
|  | 150° C. | 0.48 | 0.29 | 0.21 |
| $O_2$ | Room temp. | — | — | — |
|  | 100° C. | — | — | — |
|  | 150° C. | — | — | — |
| selectivity | | | | |
| $H_2/N_2$ | Room temp. | 56 | 38 | 36 |
|  | 100° C. | 57 | 54 | 52 |
|  | 150° C. | 52 | 61 | 57 |

TABLE 3-continued

| | | Example | | |
|---|---|---|---|---|
| Conditions | Bias (V) | 4 10 | 5 30 | 6 40 |
| $O_2/N_2$ | Room temp. | — | — | — |
| | 100° C. | — | — | — |
| | 150° C. | — | — | — |

The unit of gas permeance is $10^{-7}$ mol/m$^2 \cdot$ s $\cdot$ Pa.

Examples 7–8

Different Gas Phase Compositions

All membrane growth conditions and surface modification conditions were the same for Examples 7–8 and Example 6, except the gas phase composition for membrane growth. The gas phase composition separation and the results are shown in Table 4.

TABLE 4

| | | Examples | |
|---|---|---|---|
| Conditions | Gas phase composition | 7 40% HMDSO + 60% $O_2$ | 8 80% HMDSO + 20% $O_2$ |
| permeance | | | |
| $H_2$ | Room temp. | 3.61 | 31.13 |
| | 100° C. | 5.11 | 48.08 |
| | 150° C. | 6.58 | 59.72 |
| $N_2$ | Room temp. | 0.35 | 1.58 |
| | 100° C. | 0.29 | 1.87 |
| | 150° C. | 0.29 | 2.36 |
| $O_2$ | Room temp. | 0.40 | 5.79 |
| | 100° C. | 0.37 | 6.57 |
| | 150° C. | 0.35 | 6.94 |
| selectivity | | | |
| $H_2/N_2$ | Room temp. | 11 | 20 |
| | 100° C. | 18 | 26 |
| | 150° C. | 23 | 25 |
| $O_2$ | Room temp. | 1.18 | 3.67 |
| | 100° C. | 1.27 | 3.51 |
| | 150° C. | 1.23 | 2.94 |

The unit of gas permeance is $10^{-7}$ mol/m$^2 \cdot$ s $\cdot$ Pa.

Example 9

All membrane growth conditions and surface modification conditions were the same for Examples 9 and Example 6, except the duration for membrane growth before surface modification one hour with respect to 30 minutes. The results are shown in Table 5.

TABLE 5

| Conditions | Duration for deposition | Example 9 30 min |
|---|---|---|
| permeance | | |
| $H_2$ | Room temperature | 3.84 |
| | 100° C. | 7.49 |
| | 150° C. | 11.56 |
| $N_2$ | Room temperature | 0.45 |
| | 100° C. | 0.39 |
| | 150° C. | 0.38 |

TABLE 5-continued

| Conditions | Duration for deposition | Example 9 30 min |
|---|---|---|
| $O_2$ | Room temperature | 0.50 |
| | 100° C. | 0.49 |
| | 150° C. | 0.51 |
| selectivity | | |
| $H_2/N_2$ | Room temperature | 9 |
| | 100° C. | 19 |
| | 150° C. | 30 |
| $O_2/N_2$ | Room temperature | 1.11 |
| | 100° C. | 1.26 |
| | 150° C. | 1.36 |

The unit of gas permeance is $10^{-7}$ mol/m$^2 \cdot$ s $\cdot$ Pa.

Examples 10–12

Change of Gas Phase Composition in Surface Modification

All membrane growth conditions and surface modification conditions were the same for Examples 10–12 and Example 1–3, except the gas phase composition in surface modification. The separation results are shown in Table 6.

TABLE 6

| | | Examples | | |
|---|---|---|---|---|
| Conditions | Gas phase composition | 10 80% HMDSO + 20% Ar | 11 100% $O_2$ | 12 80% HMDSO + 20% $O_2$ |
| permeance | | | | |
| $H_2$ | Room temp. | 26.89 | 2.91 | 12.84 |
| | 100° C. | 32.04 | 3.32 | 15.34 |
| | 150° C. | 32.95 | 3.89 | 17.19 |
| $N_2$ | Room temp. | 0.66 | 0.31 | 0.15 |
| | 100° C. | 0.85 | 0.27 | 0.21 |
| | 150° C. | 1.07 | 0.25 | 0.25 |
| $O_2$ | Room temp. | 2.45 | 0.36 | 0.59 |
| | 100° C. | 3.04 | 0.31 | 0.87 |
| | 150° C. | 3.83 | 0.30 | 1.01 |
| selectivity | | | | |
| $H_2/N_2$ | Room temp. | 40 | 9 | 81 |
| | 100° C. | 38 | 12 | 73 |
| | 150° C. | 31 | 16 | 69 |
| $O_2/N_2$ | Room temp. | 3.67 | 1.17 | 3.70 |
| | 100° C. | 3.56 | 1.15 | 4.16 |
| | 150° C. | 3.57 | 1.20 | 4.05 |

The unit of gas permeance is $10^{-7}$ mol/m$^2 \cdot$ s $\cdot$ Pa.

Examples 13–16

Change of Gas Phase Composition in Surface Modification

All membrane growth conditions and surface modification conditions were the same for Examples 13–16 and Example 1–3, except the gas phase composition and the bias voltage during surface modification. The separation results are shown in Table 7.

TABLE 7

| | | Example | | | |
|---|---|---|---|---|---|
| | | 13 | 14 | 15 | 16 |
| | Gas phase comp. | Ar | | $CH_4$ | |
| Conditions | ENI bias voltage | 50 V | 100 V | 30 V | 50 V |
| permeance | | | | | |
| $H_2$ | Room temp. | 2.55 | 1.28 | 2.53 | 1.65 |
| | 100° C. | 4.69 | 1.81 | 6.28 | 2.48 |
| | 150° C. | 8.35 | 2.63 | 10.54 | 4.54 |
| $N_2$ | Room temp. | 0.40 | 0.24 | 0.17 | 0.36 |
| | 100° C. | 0.40 | 0.21 | 0.19 | 0.32 |
| | 150° C. | 0.42 | 0.19 | 0.23 | 0.31 |
| $O_2$ | Room temp. | 0.46 | 0.23 | 0.36 | 0.36 |
| | 100° C. | 0.63 | 0.19 | 0.45 | 0.32 |
| | 150° C. | 0.74 | 0.18 | 0.60 | 0.34 |
| selectivity | | | | | |
| $H_2/N_2$ | Room temp. | 6 | 5 | 15 | 5 |
| | 100° C. | 12 | 9 | 33 | 8 |
| | 150° C. | 20 | 14 | 46 | 15 |
| $O_2/N_2$ | Room temp. | 1.15 | 0.96 | 2.13 | 1.00 |
| | 100° C. | 1.59 | 0.92 | 2.30 | 0.98 |
| | 150° C. | 1.77 | 0.97 | 2.65 | 1.10 |

The unit of gas permeance is $10^{-7}$ mol/m² · s · Pa.

Examples 17–18

All membrane growth conditions and surface modification conditions were the same for Examples 17–18 and Example 1–3, except that the gas phase composition was 100% $CH_4$. After surface modification, the membranes were baked in a high temperature furnace under 0.007 torr and at 500° C. for 4 hrs with a temperature rise rate of 2.4° C./min. The separation results are shown in Table 8.

TABLE 8

| | | Examples | |
|---|---|---|---|
| | | 17 | 18 |
| Conditions | ENI bias voltage | 10 V | 30 V |
| permeance | | | |
| $H_2$ | Room temperature | 4.15 | 1.99 |
| | 100° C. | 6.88 | 2.25 |
| | 150° C. | 9.65 | 3.02 |
| $N_2$ | Room temperature | 0.22 | 0.17 |
| | 100° C. | 0.26 | 0.12 |
| | 150° C. | 0.27 | 0.11 |
| $O_2$ | Room temperature | 0.52 | 0.38 |
| | 100° C. | 0.70 | 0.27 |
| | 150° C. | 0.81 | 0.25 |
| selectivity | | | |
| $H_2/N_2$ | Room temperature | 19 | 12 |
| | 100° C. | 26 | 19 |
| | 150° C. | 36 | 27 |
| $O_2/N_2$ | Room temperature | 2.36 | 2.24 |
| | 100° C. | 2.69 | 2.25 |
| | 150° C. | 2.99 | 2.27 |

The unit of gas permeance is $10^{-7}$ mol/m² · s · Pa.

Examples 19–20

All membrane growth conditions and surface modification conditions were the same for Examples 19–20 and Example 1–3, except the gas phase composition (90% $CH_4$+10% aluminium tri-sec-butanolate for the former). After the surface modification, the membranes were baked in a high temperature furnace under 0.007 torr and at 500° C. for 4 hrs with a temperature rise rate of 2.4° C./min. The surface modification conditions and separation results are shown in Table 9.

TABLE 9

(The unit of gas permeance is $10^7$ mol/m² · s · Pa)

| | | Example | |
|---|---|---|---|
| | | 19 | |
| | | 90% $CH_4$ + | 20 |
| | Gas phase | 10% Aluminium | 100% Aluminium |
| | composition | tri-sec-butanolate | tri-sec-butanolate |
| Conditions | ENI bias voltage | 30 V | 50 V |
| permeance | | | |
| $H_2$ | Room temperature | 1.74 | 3.57 |
| | 100° C. | 2.97 | 4.83 |
| | 150° C. | 4.29 | 6.21 |
| $N_2$ | Room temperature | 0.13 | 0.19 |
| | 100° C. | 0.11 | 0.14 |
| | 150° C. | 0.10 | 0.12 |
| $O_2$ | Room temperature | 0.34 | 0.56 |
| | 100° C. | 0.29 | 0.42 |
| | 150° C. | 0.29 | 0.39 |
| selectivity | | | |
| $H_2/N_2$ | Room temperature | 13 | 19 |
| | 100° C. | 27 | 35 |
| | 150° C. | 43 | 52 |
| $O_2$ | Room temperature | 2.62 | 2.95 |
| | 100° C. | 2.64 | 3.01 |
| | 150° C. | 2.90 | 3.25 |

Examples 21–22

Growth of a Membrane on a Porous Graphite Substrate

Using an inductively-coupled-plasma chemical vapor deposition (ICP CVD) to deposit a membrane on a porous graphite substrate, the growth conditions were: a total pressure of 0.05 torr, a vapor phase composition of 50% HMDSO+50% $O_2$ (based on the partial pressure ratio), an RF power of 100W, and a deposition time of 3 hours. The surface modification conditions were the same as the membrane growth conditions, except that a negative bias voltage of 50V was applied to the substrate. After the surface modification, the substrate was baked in a high temperature furnace under a pressure of 0.007 torr, and at 600° C. for 4 hours with a temperature increase rate of 2.4° C./min. Table 10 shows various durations of the bias voltage and the results of gas separation.

TABLE 10

| | | Examples | |
|---|---|---|---|
| | | 21 | 22 |
| Conditions | Duration (s) | 10 | 30 |
| permeance | | | |
| $H_2$ | Room temperature | 2.58 | 1.15 |
| | 100° C. | 3.69 | 2.46 |
| | 150° C. | 4.58 | 3.17 |
| $N_2$ | Room temperature | 0.23 | 0.13 |
| | 100° C. | 0.15 | 0.19 |
| | 150° C. | 0.14 | 0.18 |
| $O_2$ | Room temperature | 0.28 | 0.15 |
| | 100° C. | 0.20 | 0.21 |
| | 150° C. | 0.20 | 0.20 |

TABLE 10-continued

| | | Examples | |
|---|---|---|---|
| Conditions | Duration (s) | 21<br>10 | 22<br>30 |
| selectivity | | | |
| $H_2/N_2$ | Room temperature | 11 | 9 |
| | 100° C. | 25 | 13 |
| | 150° C. | 33 | 18 |
| $O_2/N_2$ | Room temperature | 1.22 | 1.15 |
| | 100° C. | 1.33 | 1.11 |
| | 150° C. | 1.43 | 1.11 |

The unit of gas permeance is $10^{-7}$ mol/m$^2$ · s · Pa.

Although the present invention has been described with reference to specific details of certain embodiments thereof, it is not intended that such details should be regarded as limitations upon the scope of the invention except as and to the extent that they are included in the accompanying claims. Many modifications and variations are possible in light of the above disclosure.

What is claimed is:

1. A process for preparing a carbon molecular sieve membrane comprising the following steps:
    (a) growing an amorphous carbon-based membrane on a porous substrate at a low temperature, where said membrane is able to be pyrolyzed or decomposed at a temperature higher than the growth temperature;
    (b) performing a surface modification by bombarding said membrane with energized gaseous ions; and
    (c) baking said surface-modified membrane at a temperature higher than the growth temperature in Step (a), so that a membrane having a gas separation effect is formed.

2. The process according to claim 1, wherein said amorphous carbon-based membrane comprises carbon as a major portion thereof and, optionally, elements selected from the group consisting of Al, Si, O, N, P and F.

3. The process according to claim 1, wherein said surface modification by bombarding the membrane with energized gaseous ions is carried out with a means selected from means for generating plasma, laser or ion beams, wherein a negative bias voltage is applied to said porous substrate, or an ion gun or an ion implantation device is used to accelerate ions.

4. The process according to claim 3, wherein said surface modification is carried out by: bombarding said membrane with energized gaseous ions at a pressure less than $10^5$ Pa and with an ion acceleration bias voltage less than 5000 volts.

5. The process according to claim 1, wherein said baking is carried out at a pressure of 0.001 Pa–$2\times10^5$ Pa, in an environment of vacuum, $N_2$ or an inert gas, and for a period of time up to 100 hours.

6. The process according to claim 1 further comprising repeating Steps (a), (b) and (c) one or more cycles, thereby further improving the separation effect of the membrane.

7. The process according to claim 1, wherein said growth of said amorphous carbon-based membrane in Step (a) comprises using an inductively-coupled-plasma chemical vapor deposition (ICP CVD) to grow said membrane on said porous substrate under conditions comprising a gas phase pressure of $10^{-3}$–100 torr; a reaction gas mixture comprising 5–100 vol. % of a carbon-containing gas, and 95–0 vol. % of $O_2$ or an oxygen-containing gas; a total flowrate of 0.5–10 sccm; RF high frequency power of 20–1000 W; and a processing time of 0.1–20 hours.

8. The process according to claim 7, wherein said carbon-containing gas is hexamethyldisiloxane (HMDSO) or methane.

9. The process according to claim 7, wherein said reaction gas mixture comprises 5–95 vol. % of said carbon-containing gas, and 95–5 vol. % of $O_2$.

10. The process according to claim 7, wherein said surface modification by bombarding said membrane with energized gaseous ions in Step (b) is carried out by means of an inductively-coupled-plasma chemical vapor deposition and applying a negative bias voltage to said porous substrate, wherein conditions of generating plasma comprise a gas pressure of $10^{-3}$–100 torr; a gas composition comprising 5–100 vol. % of a carbon-containing gas, 95–0 vol. % of $O_2$ or an oxygen-containing gas, and 95–0 vol. % of an inert gas; a total gas flowrate of 0.5–10 sccm; RF high frequency power of 20–1000 W; and a processing time of 1–1000 second.

11. The process according to claim 10, wherein said carbon-containing gas is hexamethyldisiloxane (HMDSO) or methane.

12. The process according to claim 10, wherein said gas composition comprises 5–100 vol. % of said carbon-containing gas, and 95–0 vol. % of $O_2$.

13. The process according to claim 12, wherein said carbon-containing gas is hexamethyldisiloxane (HMDSO).

14. The process according to claim 10, wherein said gas composition comprises 5–100 vol. % of said carbon-containing gas, and 95–0 vol. % of said inert gas.

15. The process according to claim 14, wherein said carbon-containing gas is hexamethyldisiloxane (HMDSO).

16. The process according to claim 10, wherein said processing time is of 3–30 seconds.

17. The process according to claim 16, wherein said negative bias voltage is of 10–100 volts.

18. The process according to claim 10, wherein said negative bias voltage is of 10–100 volts.

19. The process according to claim 1, wherein said surface modification by bombarding said membrane with energized gaseous ions in Step (b) is carried out by means of an inductively-coupled-plasma chemical vapor deposition and applying a negative bias voltage to said porous substrate, wherein conditions of generating plasma comprise a gas pressure of $10^{-3}$–100 torr; a gas composition comprising 5–100 vol. % of a carbon-containing gas, 95–0 vol. % of $O_2$ or an oxygen-containing gas, and 95–0 vol. % of an inert gas; a total gas flowrate of 0.5–10 sccm; RF high frequency power of 20–1000 W; and a processing time of 1–1000 second.

20. The process according to claim 19, wherein said carbon-containing gas is hexamethyldisiloxane (HMDSO) or methane.

21. The process according to claim 19, wherein said gas composition comprises 5–100 vol. % of said carbon-containing gas, and 95–0 vol. % of $O_2$.

22. The process according to claim 21, wherein said carbon-containing gas is hexamethyldisiloxane (HMDSO).

23. The process according to claim 19, wherein said gas composition comprises 5–100 vol. % of said carbon-containing gas, and 95–0 vol. % of said inert gas.

24. The process according to claim 23, wherein said carbon-containing gas is hexamethyldisiloxane (HMDSO).

25. The process according to claim 19, wherein said processing time is of 3–30 seconds.

26. The process according to claim 25, wherein said negative bias voltage is of 10–100 volts.

27. The process according to claim 19, wherein said negative bias voltage is of 10–100 volts.

* * * * *